United States Patent [19]

Frey

[11] 4,215,309

[45] Jul. 29, 1980

[54] HIGH EFFICIENCY SWITCHING CIRCUIT

[76] Inventor: Raymond A. Frey, 4465 Pacific Coast Hwy., #B-209, Torrance, Calif. 90505

[21] Appl. No.: 852,294

[22] Filed: Nov. 17, 1977

[51] Int. Cl.² ............................................ G01R 31/22
[52] U.S. Cl. ............................ 324/158 D; 324/158 T
[58] Field of Search ............ 324/158 D, 158 T, 73 AT

[56] References Cited

U.S. PATENT DOCUMENTS

| 3,328,693 | 6/1967 | Yarbrough | 324/158 D |
| 3,478,264 | 11/1969 | Tsergas | 324/158 SC |
| 3,914,690 | 10/1975 | Shellnutt | 324/158 D |

Primary Examiner—Ernest F. Karlsen
Attorney, Agent, or Firm—Martin R. Horn

[57] ABSTRACT

A circuit for testing semiconductor devices, such as diodes, which alternately applies a forward current and a reverse bias voltage. The devices are series connected during the forward current portion of the cycle by means of silicon controlled rectifiers and parallel connected for the reverse bias portion of the cycle.

48 Claims, 1 Drawing Figure

HIGH EFFICIENCY SWITCHING CIRCUIT

BACKGROUND OF THE INVENTION

1. Field of the Invention

This invention relates to the field of semiconductor testing circuits.

2. Prior Art

A well known phenomenon associated with the life of electronic components is known as "infant mortality", a term which is used to describe the relatively high failure rate observed in new components. The initial high failure rate of components normally drops to a low value after a short period of operation, and continues low for a relatively long period of time. In order to avoid the effects of infant mortality in power semiconductor devices, it is common to "burn in" such components until the period of infant mortality is past. The "burn in" typically comprises alternately passing a high forward current through the device, and applying a reverse bias voltage approximately equal to the rated peak inverse voltage. For convenience, this is usually done at power line frequency, forward current being passed through the device on one-half of the cycle, and the rated peak inverse voltage being applied on the other half cycle.

The prior art method of accomplishing the burn-in involves connecting many of the devices being processed in parallel, each with a series resistor, so as to avoid variations in current due to differences in voltage drop among the devices being burned in, and also to avoid the difficulties which would accompany a device failure. The power dissipated in this series resistor is substantial and, in fact, the cost of this power represents a significant factor with respect to the total cost of the device.

Circuits have been devised by previous inventors whereby several devices under test (being "burned in") are put in series, and only one series resistor for the entire series string is required. Unfortunately, many semiconductor devices have very high peak inverse voltage ratings, for example 1500 volts, so that if more than a few are put in series, the inverse voltage required becomes excessive. Thus, this improvement, while reducing the per unit power cost somewhat, offers only a limited improvement.

SUMMARY OF THE INVENTION

The present invention overcomes the problems of the prior art methods of "burn in" by providing a switching circuit which allows a large number of devices to be connected in series during the forward current half cycle, and to be connected in parallel for purposes of applying the test inverse voltage during the inverse half cycle. In this way, a single regulated current source may be utilized to provide the forward test current for all semiconductors under test, without the necessity of loading resistors to equalize the currents through the devices, and yet the test inverse voltage required to be applied is only that of a single device.

DETAILED DESCRIPTION OF THE DRAWING

Figure 1:
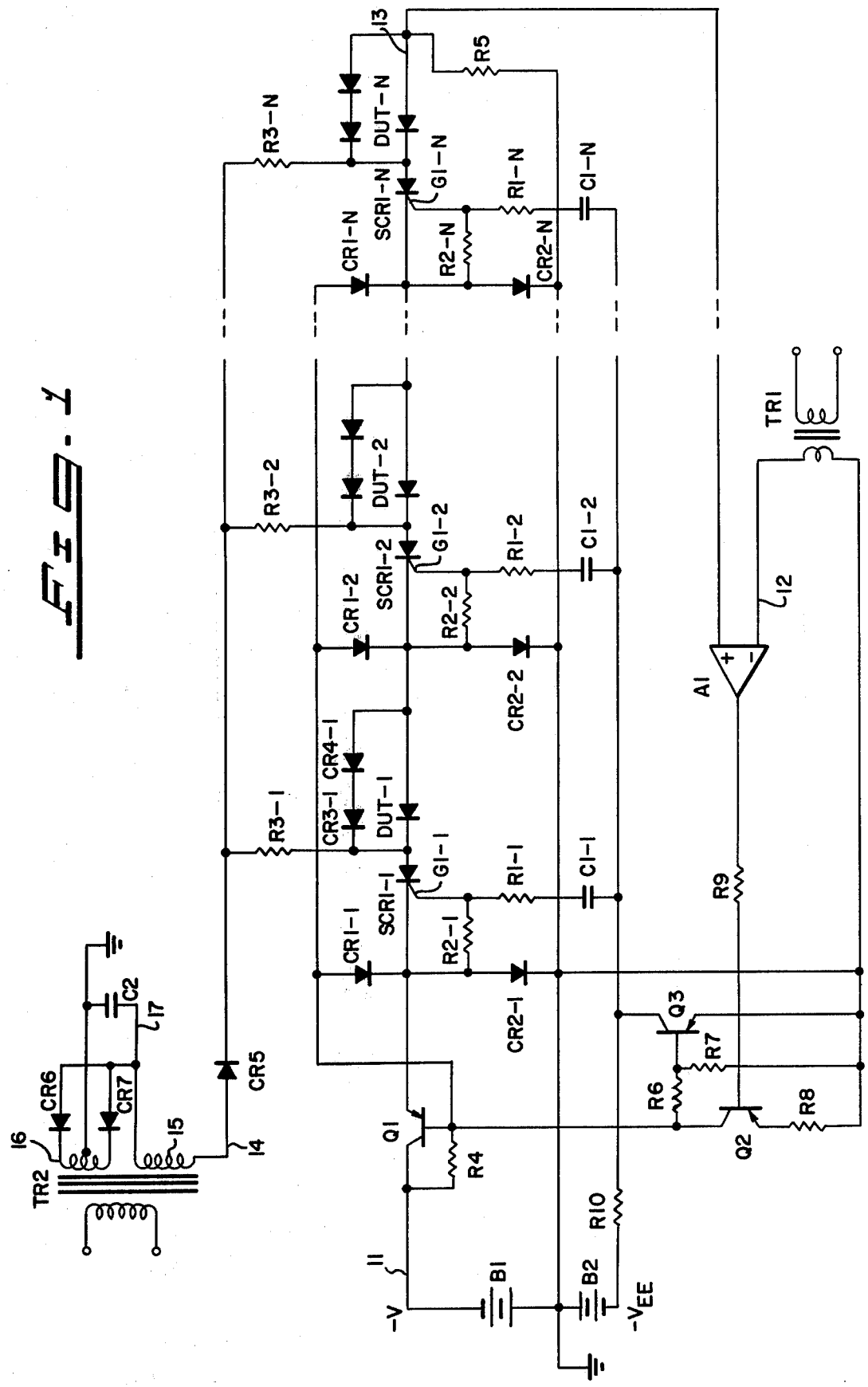

FIG. 1 is a circuit diagram of the invented circuit.

DETAILED DESCRIPTION OF THE INVENTION

The circuit of a presently preferred embodiment of the present invention, as shown in FIG. 1, depicts a burn in circuit for processing n semiconductor devices, DUT-1, DUT-2, ..., DUT-n, where n can be any number. As will be discussed below, n is limited only by the voltage V which is available to drive the desired forward test current through the circuit. The voltage V is shown in FIG. 1 as being developed by a battery B1, but it will be appreciated that any other source of power will do as well. The battery B1 develops a voltage V on line 11 which is negative with respect to "ground", line 10. In series with battery B1, in line 11, is a regulating transistor Q1 which regulates the current through the devices under test, DUT-1 through DUT-n.

Associated with each device, DUT, under test, and in series therewith, is a silicon controlled rectifier SCR1. When the silicon controlled rectifiers are "on" a series circuit is made including battery B1, regulating transistor Q1, DUT-1, SCR1-1, DUT-2, SCR1-2, ..., DUT-n, SCR1-n, and a small resistor R5. The value of V is such that if Q1 is saturated, a current greater than the required test current would flow. The current which actually does flow is determined by the voltage output of transformer TR1.

The voltage output of transformer TR1 is applied between ground, line 10, and the negative input to operational amplifier A1. The positive input to amplifier A1 is connected to resistor R5 and thus the output of operational amplifier A1 depends upon the difference between the voltage of TR1 and the voltage drop across R5, which, of course is proportional to the current through it. The output of amplifier A1 is coupled through transistor Q2 to the base of transistor Q1, which in turn regulates the current through the series test circuit. The gain between the input terminals of amplifier A1 and the base of transistor Q1 is relatively high so that the instantaneous voltage across resistor R5 is essentially equal to the output voltage of transformer TR1, during the half cycle of forward conduction of the devices under test. Thus, the instantaneous current through the devices under test during the forward conduction half cycle is equal to the output voltage of transformer TR1 divided by the resistance of R5. Since the output of TR1 is sinusoidal, the forward current through the devices under test is also sinusoidal during the forward conduction half cycle.

Since line 11 is negative with respect to ground, node 13, at the top end of R5 can never be positive with respect to ground and therefore amplifier A1 will have a high negative output during the entire half cycle when the output of TR1 on line 12 is positive with respect to ground. Transistor Q2 is then saturated and transistor Q3 is cut off.

At the start of the forward conduction half cycle, as the output of transformer TR1 drops to zero and becomes negative, the output of amplifier A1 also drops toward zero and transistor Q2 comes out of saturation. The base of transistor Q3 becomes more negative so that Transistor Q3 starts to conduct, providing a positive pulse to the gates G1 of the silicon controlled rectifiers SCR1 (through capacitors C1, and resistors R1, with diodes CR2 providing a ground return for the turn-on pulse). The positive pulse turns the silicon controlled rectifiers on and for the balance of the negative half cycle of TR1, the current through the devices under test is a half cycle of a sine wave with an amplitude determined by the voltage of TR1 and the resistance of R5. The forward current amplitude can be set to the desired value by adjusting either or both of the resistance of R5 or the voltage of TR1.

As the negative half cycle of TR1 comes to an end, the current through the devices under test, DUT, and the silicon controlled rectifiers, SCR1, drops to zero, and the silicon controlled rectifiers SCR1 turn off.

For the next half cycle the silicon controlled rectifiers SCR1 remain off. During this half cycle, terminal 14 of TR2 is positive with respect to ground. Winding 15 of transformer TR2 generates a voltage equal to the desired inverse test voltage. This voltage is applied as a reverse bias voltage across the devices under test through a path which includes diode CR5, which is forward biased, resistors R3, the devices under test, DUT, and the diode CR2 which is associated with the next higher numbered device under test. In the case of the n th device under test, the last element in the inverse test voltage series circuit is resistor R5 instead of a diode CR2.

Winding 16 of transformer, in conjunction with diodes CR6 and CR7 and capacitor C2 provides a small DC voltage on line 17 which offsets the voltage on line 14 in a negative direction slightly. This offset has the effect of delaying the advent of the inverse test voltage across the devices under test by a small period of time, for example, 50 microseconds. It is desirable to so delay the inverse test voltage so as to assure that the silicon controlled rectifiers SCR1 are off before the inverse test voltage is applied. If the silicon controlled rectifiers do not turn off before the onset of the positive half cycle of transformer TR2, there will be a current path from terminal 14 of transformer TR2 through CR5, R3, SCR1, and CR2. Once current starts to flow in this path, it will not be possible to turn the silicon controlled rectifiers off until just before the onset of the next positive half cycle of transformer TR2. The sequence will repeat until such time as the silicon controlled rectifiers turn off before the inverse test voltage starts to rise.

During the inverse test voltage half cycle, Q3 is cut off and diodes CR1 provide a path which allows capacitors C1 to charge toward the voltage VEE. The charge path includes R10, R1, R2, CR1, Q2 (which is saturated), and R8. Assuming the steady state operation of the system, during the time of the positive pulse to gates G1 previously described, current flow through capacitors C1 causes a change in charge such that during the inverse test voltage half cycle the gates G1 will tend to go negative with respect to −V, and under this condition diodes CR1 allow the charges on capacitors C1 to adjust so that just prior to the onset of the forward current half cycle, gates G1 will be at a potential of essentially zero with respect to ground.

The circuit, as described to this point will operate to burn-in diodes or other semiconductor devices in a very satisfactory manner. However, in the event that one of the diodes being burned-in were to fail by opening during the burn-in period, the circuit would cease to operate because there would not be a circuit for forward circuit. To guard against this possibility two diodes, CR3 and CR4 may be shunted across each device under test DUT. Since two diodes are shunted across each device under test, no appreciable current will flow through CR3 and CR4 unless their associated device under test DUT should fail. In that event CR3 and CR4 will pass the test current and the operation of the circuit will not be interrupted.

What has been described is one embodiment of a circuit for alternately applying forward current and inverse voltage to a semiconductor device without the inefficiencies present in prior art circuits. Various modifications of the invented circuit which would fall within the spirit of the invention are possible and these modifications are intended to be covered herein as defined in the appended claims.

What is claimed is:

1. A circuit for simultaneously testing a plurality of semiconductor devices which comprises:
    (a) means for coupling said semiconductor devices in series;
    (b) means for passing a predetermined forward current through said series coupled devices;
    (c) means for decoupling said devices from said series connection and for coupling said devices in a parallel configuration; and
    (d) means for applying a predetermined reverse bias voltage to said devices while coupled in parallel, said forward current and said reverse bias voltage being applied alternately.

2. The circuit as recited in claim 1 wherein said reverse bias voltage is applied to a circuit comprised of a parallel combination of said devices, each having an impedance in series therewith.

3. The circuit as recited in claim 2 and further including a diode coupled in series with each of said devices, said reverse bias voltage being applied across a parallel combination comprised of a plurality of series combinations each comprises of one of said devices, one of said impedances, and one of said diodes.

4. The circuit as recited in claim 3 and further including means for delaying the onset of said reverse bias voltage until after said forward current has terminated.

5. The circuit as recited in claim 4 wherein said reverse bias voltage is substantially a half sinusoidal wave.

6. The circuit as recited in claim 5 wherein said delay means comprises a source of DC voltage in series with the source of voltage for said reverse bias voltage.

7. The circuit as recited in claim 1 wherein said means for coupling said devices in series comprises a plurality of electronic switches.

8. The circuit as recited in claim 7 and further including resistance means in series with said devices for providing a feedback signal to control the amplitude of said forward current.

9. The circuit as recited in claim 8 and further including voltage reference means, said forward current being responsive to the amplitudes of said feedback signal and said voltage reference means.

10. The circuit as recited in claim 9 wherein said reference voltage is sinusoidal.

11. The circuit as recited in claim 10 and further including means for turing said electronic switches on at substantially the start of each cycle of said reference voltage.

12. The circuit as recited in claim 11 wherein said electronic switches are silicon controlled rectifiers.

13. The circuit as recited in claim 10 and further including current regulating means coupled in series with said series coupled devices.

14. The circuit as recited in claim 13 where said current regulating means is a transistor.

15. The circuit as recited in claim 14 where said reference voltage is sinusoidal.

16. The circuit as recited in claim 15 and further including means for turning said electronic switches on at substantially the start of each cycle of said reference voltage.

17. The circuit as recited in claim 16 wherein said reverse bias voltage is applied across a parallel circuit of said devices, said devices each having an impedance in series therewith.

18. The circuit as recited in claim 17 and further including a diode in series with said devices, said reverse bias voltage being applied across a parallel combination of series circuits comprising one of said impedances, one of said devices, and one of said diodes.

19. The circuit as recited in claim 18 and further including means for delaying the onset of said reverse bias voltage until after said forward current has terminated.

20. The circuit as recited in claim 17 where said reverse bias voltage is substantially a half sinusoidal wave.

21. The circuit as recited in claim 18 where said means for delaying the onset of said reverse bias voltage comprises a DC voltage coupled in series with said reverse bias voltage.

22. The circuit as recited in claim 19 and further including diode means coupled across each of said devices whereby if any of said devices should fail during test, said forward current will not be interrupted.

23. A circuit for testing semiconductor devices which comprises:
  (a) a series circuit comprised of a plurality of said devices to be tested and a plurality of switches alternating with said devices;
  (b) means for causing forward current flow through said series circuit when said switches are closed; and
  (c) means for applying reverse bias voltage to said devices while said devices are in a parallel configuration during times when said switches are open.

24. The circuit as recited in claim 23 and further including means for closing said switches periodically.

25. The circuit as recited in claim 24 and further including means for setting said forward current.

26. The circuit as recited in claim 25 where said means for setting said forward current includes means for obtaining a voltage proportional to said forward current and comparing it with a reference voltage.

27. The circuit as recited in claim 26 where said reference voltage is sinusoidal.

28. The circuit as recited in claim 27 where said means for closing said switches is responsive to said reference voltage.

29. The circuit as recited in claim 28 and further including diode means shunting each of said devices being tested.

30. The circuit as recited in claim 28 and further including:
  (a) a source of periodic voltage; and
  (b) a plurality of resistances for coupling a first terminal of said source of periodic voltage to the first electrodes of said devices being tested, the second electrodes of said devices under test being coupled to the second terminal of said source of periodic voltage whereby said periodic voltage appears as a reverse bias voltage across said devices being tested.

31. The circuit as recited in claim 30 where said periodic voltage is substantially a half sine wave.

32. The circuit as recited in claim 31 and further including means for delaying the onset of said periodic voltage until said switches are off.

33. The circuit as recited in claim 32 where said means for delaying the onset of said periodic voltage comprises a DC voltage source in series with said periodic voltage.

34. The circuit as recited in claim 23 and further including:
  (a) a source of periodic voltage; and
  (b) a plurality of resistances for coupling a first terminal of said source of periodic voltage to the first electrodes of said devices being tested, the second electrodes of said devices under test being coupled to the second terminal of said source of periodic voltage whereby said periodic voltage appears as a reverse bias voltage across said devices being tested.

35. The circuit as recited in claim 34 where said periodic voltage is substantially a half sine wave.

36. The circuit as recited in claim 35 and further including means for delaying the onset of said periodic voltage until said switches are off.

37. The circuit as recited in claim 36 where said means for delaying the onset of said periodic voltage comprises a DC voltage source in series with said periodic voltage.

38. A circuit for testing semiconductor devices which comprises:
  (a) a series circuit comprised of:
    (i) a first source of voltage,
    (ii) current regulating means,
    (iii) a plurality of devices to be tested, and
    (iv) a plurality of switching means, said switching means and said devices alternating in said series circuit;
  (b) means for actuating said switching means whereby current will flow in said series circuit;
  (c) a second source of voltage; and
  (d) means for applying said second source of voltage to said devices while said devices are in a parallel configuration during times when current is not flowing in said series circuit, the polarity of said second source of voltage reverse biasing said devices.

39. The circuit as recited in claim 38 where said switching means are switched on responsive to a periodic reference voltage.

40. The circuit as recited in claim 39 where said current regulating means regulates the current in said series circuit responsive to said reference voltage.

41. The circuit as recited in claim 40 where said reference voltage is compared to a voltage proportional to said forward current whereby a signal is obtained to operate said current regulating means.

42. The circuit as recited in claim 41 where said reference voltage is sinusoidal.

43. The circuit as recited in claim 39 where said second source of voltage provides a periodic voltage of the same periodicity as said reference voltage.

44. The circuit as recited in claim 43 where the first terminal of said second source of voltage is coupled to a first of said devices being tested through a plurality of resistive means and a second element of said devices under test being coupled to the second terminal of said second source of voltage.

45. The circuit as recited in claim 44 where all but one of said second elements of said devices under test are coupled to the second terminal of said second source of voltage through diodes.

46. The circuit as recited in claim 45 where said reference voltage and said second source of voltage are sinusoidal.

47. The circuit as recited in claim 46 and further including means for delaying the onset of said reverse bias voltage until said forward current drops to zero.

48. The circuit as recited in claim 47 where said delaying means comprises a DC voltage.

* * * * *